(12) United States Patent
Nishio et al.

(10) Patent No.: US 12,199,589 B2
(45) Date of Patent: *Jan. 14, 2025

(54) FILTER DEVICE AND MULTIPLEXER

(71) Applicant: Murata Manufacturing Co., Ltd., Kyoto (JP)

(72) Inventors: Keisuke Nishio, Kyoto (JP); Syunsuke Kido, Kyoto (JP); Masanori Kato, Kyoto (JP); Hiroshi Matsubara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 550 days.

This patent is subject to a terminal disclaimer.

(21) Appl. No.: 17/452,474

(22) Filed: Oct. 27, 2021

(65) Prior Publication Data

US 2022/0052666 A1    Feb. 17, 2022

Related U.S. Application Data

(63) Continuation of application No. 16/694,446, filed on Nov. 25, 2019, now Pat. No. 11,190,163.

(30) Foreign Application Priority Data

Nov. 29, 2018  (JP) ................. 2018-224081

(51) Int. Cl.
*H03H 9/02*     (2006.01)
*H03H 7/01*     (2006.01)
(Continued)

(52) U.S. Cl.
CPC ...... *H03H 9/02818* (2013.01); *H03H 7/0115* (2013.01); *H03H 7/075* (2013.01);
(Continued)

(58) Field of Classification Search
CPC ............... H03H 9/02; H03H 9/54; H03H 7/01
See application file for complete search history.

(56) References Cited

U.S. PATENT DOCUMENTS 7,479,848 B2    1/2009   Kuroda
8,410,869 B2    4/2013   Omote et al.
(Continued)

FOREIGN PATENT DOCUMENTS

EP          2416496 A1     2/2012
JP       2011-103593 A     5/2011
(Continued)

OTHER PUBLICATIONS

Notice of Reasons for Refusal for JP Application No. 2018-224081 dated Apr. 13, 2021.

*Primary Examiner* — Andrea Lindgren Baltzell
*Assistant Examiner* — Alan Wong
(74) *Attorney, Agent, or Firm* — Pearne & Gordon LLP

(57) ABSTRACT

A filter device having a pass band and a stop band on a lower frequency side than the pass band includes a filter having a pass band including the pass band, a series arm resonator connected in series to the filter, a first inductor directly connected in series to the series arm resonator, and a parallel arm resonator connected between a node on a path connecting the filter and the series arm resonator and the ground. The parallel arm resonator constitutes a resonance circuit having a resonant frequency at which an attenuation pole corresponding to a high frequency end of the first stop band, and the series arm resonator and the inductor constitute a resonance circuit having an anti-resonant frequency on a lower frequency side than the pass band and having a sub-resonant frequency higher than a resonant frequency of the resonance circuit.

13 Claims, 10 Drawing Sheets

(51) Int. Cl.
    *H03H 7/075*         (2006.01)
    *H03H 7/46*          (2006.01)
    *H03H 9/54*          (2006.01)
    *H03H 9/60*          (2006.01)
    *H03H 9/64*          (2006.01)
    *H03H 9/70*          (2006.01)
    *H03H 9/72*          (2006.01)

(52) U.S. Cl.
    CPC .......... *H03H 7/46* (2013.01); *H03H 9/02086* (2013.01); *H03H 9/542* (2013.01); *H03H 9/605* (2013.01); *H03H 9/6483* (2013.01); *H03H 9/703* (2013.01); *H03H 9/72* (2013.01)

(56) References Cited

U.S. PATENT DOCUMENTS

| | | | |
|---|---|---|---|
| 10,141,913 B2 * | 11/2018 | Takamine | ............ H03H 9/0576 |
| 10,211,799 B2 * | 2/2019 | Tani | ........................ H03H 9/542 |
| 10,333,484 B2 | 6/2019 | Komatsu | |
| 10,615,775 B2 | 4/2020 | Takamine et al. | |
| 11,190,163 B2 * | 11/2021 | Nishio | ..................... H03H 7/38 |
| 2007/0159274 A1 | 7/2007 | Onzuka | |
| 2013/0147678 A1 | 6/2013 | Taniguchi | |
| 2016/0301383 A1 * | 10/2016 | Tani | ..................... H03H 7/0153 |
| 2016/0344370 A1 | 11/2016 | Tani et al. | |
| 2017/0134005 A1 | 5/2017 | Takeuchi et al. | |
| 2018/0019730 A1 | 1/2018 | Takeuchi et al. | |
| 2020/0052672 A1 | 2/2020 | Kato | |

FOREIGN PATENT DOCUMENTS

| | | |
|---|---|---|
| JP | 2012-034067 A | 2/2012 |
| JP | 2016-219867 A | 12/2016 |
| JP | 2018-019392 A | 2/2018 |
| WO | 2010/116776 A1 | 10/2010 |
| WO | 2012/020595 A1 | 2/2012 |
| WO | 2015/119178 A1 | 8/2015 |
| WO | 2016/013659 A1 | 1/2016 |

\* cited by examiner

FILTER DEVICE AND MULTIPLEXER

CROSS REFERENCE TO RELATED APPLICATIONS

This application is a continuation of U.S. patent application Ser. No. 16/694,446 filed on Nov. 25, 2019, which claims priority from Japanese Patent Application No. JP2018-224081 filed on Nov. 29, 2018. The contents of these applications are incorporated herein by reference in their entireties.

BACKGROUND

The present disclosure relates to a filter device and a multiplexer. There is disclosed a band pass filter using an acoustic wave resonator in an LC high pass filter and an LC low pass filter which are connected in series (refer to, for example, International Publication No. WO2016/013659). As such, a stop band by the acoustic wave resonator is formed in the vicinity of a cutoff frequency of the LC high pass filter and the LC low pass filter, and the attenuation characteristic of a pass band of the band pass filter is improved.

However, there is a demand for an improvement in the attenuation characteristic, and in particular, it is desirable to realize a steeper attenuation characteristic at a low frequency end (i.e., high frequency end of the stop band) of the pass band.

BRIEF SUMMARY

Accordingly, the present disclosure provides a filter device or the like capable of realizing a steep attenuation characteristic at a high frequency end of a stop band.

A filter device according to an aspect of the present disclosure, which has a first pass band and a first stop band on a lower frequency side than the first pass band, includes a filter having a pass band including a first pass band, a series arm resonator connected in series to the filter, a first inductor directly connected in series to the series arm resonator, and a first parallel arm resonator connected between a first node on a path connecting the filter and the series arm resonator and the ground.

In one embodiment, the first parallel arm resonator constitutes a first resonance circuit having a resonant frequency at which an attenuation pole corresponding to a high frequency end of the first stop band is formed, and the series arm resonator and the first inductor constitute a second resonance circuit having an anti-resonant frequency on a lower frequency side than the first pass band and having a sub-resonant frequency higher than a resonant frequency of the first resonance circuit.

Other features, elements, characteristics and advantages of the present disclosure will become more apparent from the following detailed description of embodiments of the present disclosure with reference to the attached drawings.

DETAILED DESCRIPTION

Hereinafter, embodiments of the present disclosure and variations thereof will be described in detail with reference to the accompanying drawings. It should be noted that the following embodiments and modifications thereof are given by way of comprehensive or specific example only. The numerical values, shapes, materials, constituent elements, arrangement and connection forms of the constituent elements, and the like described in the following embodiments and modifications thereof are merely examples, and are not intended to limit the present disclosure. Among the constituent elements in the following embodiments and modifications thereof, constituent elements that are not described in the independent claims are described as arbitrary constituent elements.

In the present disclosure, "directly connected" means directly connected via a connection terminal and/or a wiring conductor without necessarily using other circuit elements. Meanwhile, the term "connected" includes not only a case of being directly connected via the connection terminal and/or the wiring conductor but also a case of being electrically connected using other circuit elements.

In the present disclosure, the phrase "constituted of a circuit element" includes not only a case where only the circuit element is included, but also a case where another circuit element is included in addition to the circuit element.

That is, "constituted of a circuit element" does not exclude the inclusion of another circuit element.

First Embodiment

First, a description will be given of a first embodiment.
1.1 Transmission Characteristic of Filter Device 10

Figure 1:
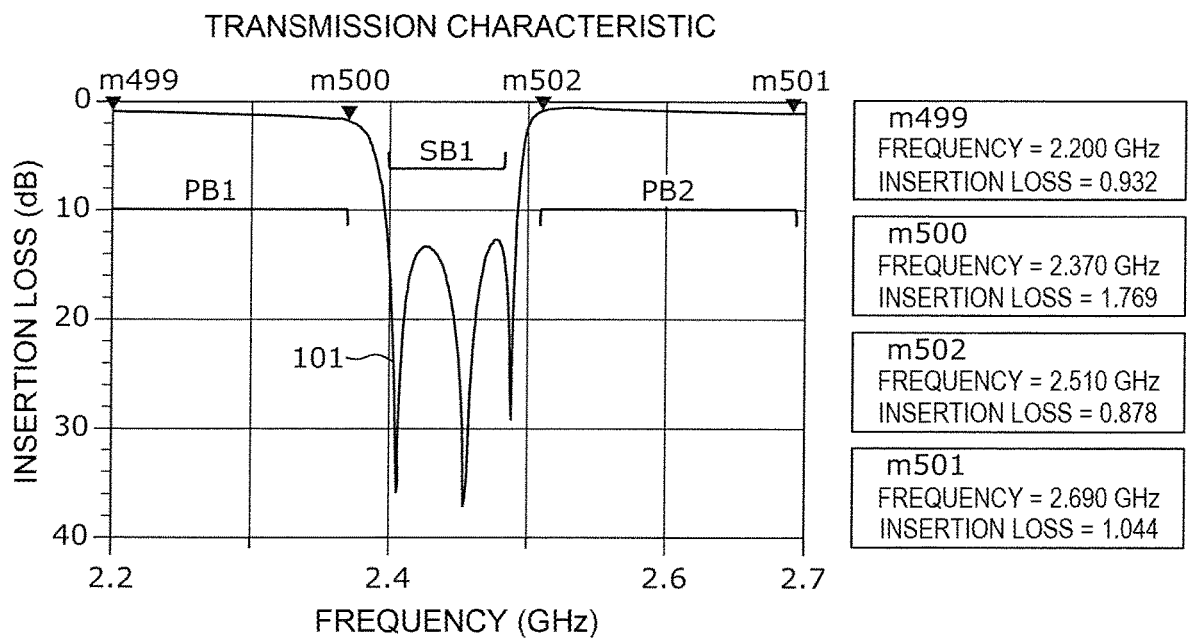
FIG. 1 is a graph illustrating a transmission characteristic of a filter device according to a first embodiment.

FIG. 1 is a graph illustrating a transmission characteristic of a filter device 10 according to a first embodiment. In FIG. 1, the horizontal axis represents a frequency, and the vertical axis represents an insertion loss. An insertion loss 101 indicates a frequency characteristic of the insertion loss in the filter device 10 according to the present embodiment. As illustrated in FIG. 1, the filter device 10 has a pass band PB1, a stop band SB1, and a pass band PB2.

The pass band PB1 is an example of a second pass band, and is located on a lower frequency side than the stop band SB1. The stop band SB1 is an example of a first stop band, and is located between the pass band PB1 and the pass band PB2. The pass band PB2 is an example of a first pass band, and is located on a higher frequency side than the stop band SB1.

In the present embodiment, as an example, the filter device 10 having a stop band corresponding to a WiFi® 2.4 GHz band within the pass band corresponding to a middle high band (MHB) will be described. In this case, the pass band PB1 corresponds to a communication band of equal to or higher than 1710 MHz and equal to or lower than 2370 MHz, the stop band SB1 corresponds to a communication band of equal to or higher than 2402 MHz and equal to or lower than 2481.5 MHz, and the pass band PB2 corresponds to a communication band of equal to or higher than 2510 MHz and equal to or lower than 2690 MHz.

The frequency and the insertion loss in marks m499, m500, m502, and m501 shown in FIG. 1 are as follows.
  m499 (2.200 GHz, 0.932 dB)
  m500 (2.370 GHz, 1.769 dB)
  m502 (2.510 GHz, 0.878 dB)
  m501 (2.690 GHz, 1.044 dB)
1.2 Circuit Configuration of Filter Device 10

Next, a circuit configuration of the filter device 10 according to the present embodiment having such a transmission characteristic will be described in detail with reference to FIG. 2.

Figure 2:
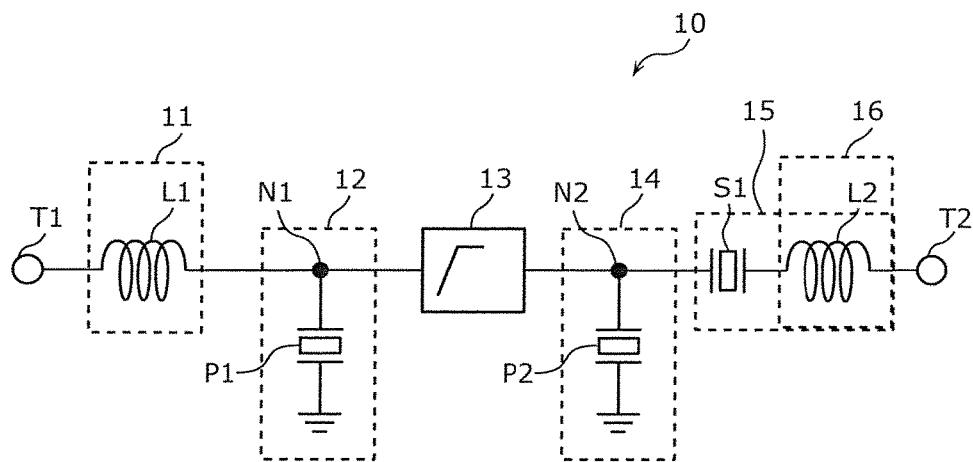
FIG. 2 is a circuit configuration diagram of the filter device according to the first embodiment.

FIG. 2 is a circuit configuration diagram of the filter device 10 according to the first embodiment. As illustrated in FIG. 2, the filter device 10 includes input/output terminals T1 and T2, matching circuits 11 and 16, resonance circuits 12, 14, and 15, and a filter 13.

The input/output terminal T1 is an example of a first input/output terminal, and the input/output terminal T2 is an example of a second input/output terminal. When the input/output terminal T1 serves as an input terminal to which a high-frequency signal is input, the input/output terminal T2 serves as an output terminal, and when the input/output terminal T2 serves as the input terminal to which a high-frequency signal is input, the input/output terminal T1 serves as the output terminal.

The matching circuit 11 is composed of an inductor L1. The matching circuit 11 performs impedance matching between circuit elements outside the filter device 10 and circuit elements in the filter device 10, which are connected to each other via the input/output terminal T1. Note that the matching circuit 11 does not necessarily have to be constituted of a series inductor. For example, the matching circuit 11 may be constituted of a series inductor, a parallel inductor, a capacitor, or any combination thereof.

The inductor L1 is directly connected to the input/output terminal T1. The inductor L1 may be a substantially chip-shaped inductor mounted on a substrate, or may be an inductor constituted of a planar coil pattern formed in the substrate.

The resonance circuit 12 is an example of a third resonance circuit, and is constituted of a parallel arm resonator P1. The resonance characteristic of the resonance circuit 12 will be described later with reference to FIG. 5A.

The parallel arm resonator P1 is an example of a second parallel arm resonator, and is connected between a node N1 on a path connecting the input/output terminals T1 and T2, and the ground. The node N1 is an example of a second node, and is disposed on a path connecting the inductor L1 and the filter 13.

The filter 13 is disposed on a path connecting the node N1 and a node N2. The filter 13 is a high pass filter having pass bands including the pass bands PB1 and PB2. The filter 13 may be any of a SAW filter, an acoustic wave filter using BAW, an FBAR filter, an LC filter, and a dielectric filter, and is not limited thereto.

The resonance circuit 14 is an example of a first resonance circuit, and is constituted of a parallel arm resonator P2. The resonance characteristic of the resonance circuit 14 will be described later with reference to FIG. 5A.

The parallel arm resonator P2 is an example of a first parallel arm resonator, and is connected between the node N2 on a path connecting the filter 13 and a series arm resonator S1, and the ground. The node N2 is an example of a first node.

The resonance circuit 15 is an example of a second resonance circuit, and is constituted of the series arm resonator S1 and an inductor L2. The resonance characteristic of the resonance circuit 15 will be described later with reference to FIG. 5A.

The series arm resonator S1 is connected in series to the filter 13. Further, the series arm resonator S1 is directly connected to the inductor L2 in series.

The inductor L2 is an example of a first inductor, and is directly connected to the series arm resonator S1 in series. The inductor L2 is directly connected to the input/output terminal T2. The inductor L2 may be a substantially chip-shaped inductor mounted on the substrate, or may be an inductor constituted of a planar coil pattern formed in the substrate.

The matching circuit 16 is constituted of the inductor L2. That is, the inductor L2 is shared by the resonance circuit 15 and the matching circuit 16. The matching circuit 16 performs impedance matching between the circuit elements outside the filter device 10 and the circuit elements in the filter device 10, which are connected to each other via the input/output terminal T2.

Note that in one embodiment, the matching circuit 11 and the resonance circuit 12 are not necessarily essential components for the filter device according to the present disclosure. That is, in one embodiment, the inductor L1 and the parallel arm resonator P1 are not necessarily essential components for the filter device according to the present disclosure.

As the parallel arm resonators P1 and P2, and the series arm resonator S1, an acoustic wave resonator can be used. More specifically, as the parallel arm resonators P1 and P2 and the series arm resonator S1, for example, a surface acoustic wave (SAW) resonator, a bulk acoustic wave (BAW) resonator, a film bulk acoustic resonator (FBAR), or the like can be used.

1.3 Transmission Characteristic of Filter Device 10X

Here, a comparative example for explaining various characteristics of the filter device 10 according to the present embodiment will be described. First, a transmission characteristic of a filter device 10X according to the comparative example will be described with reference to FIG. 3.

Figure 3:
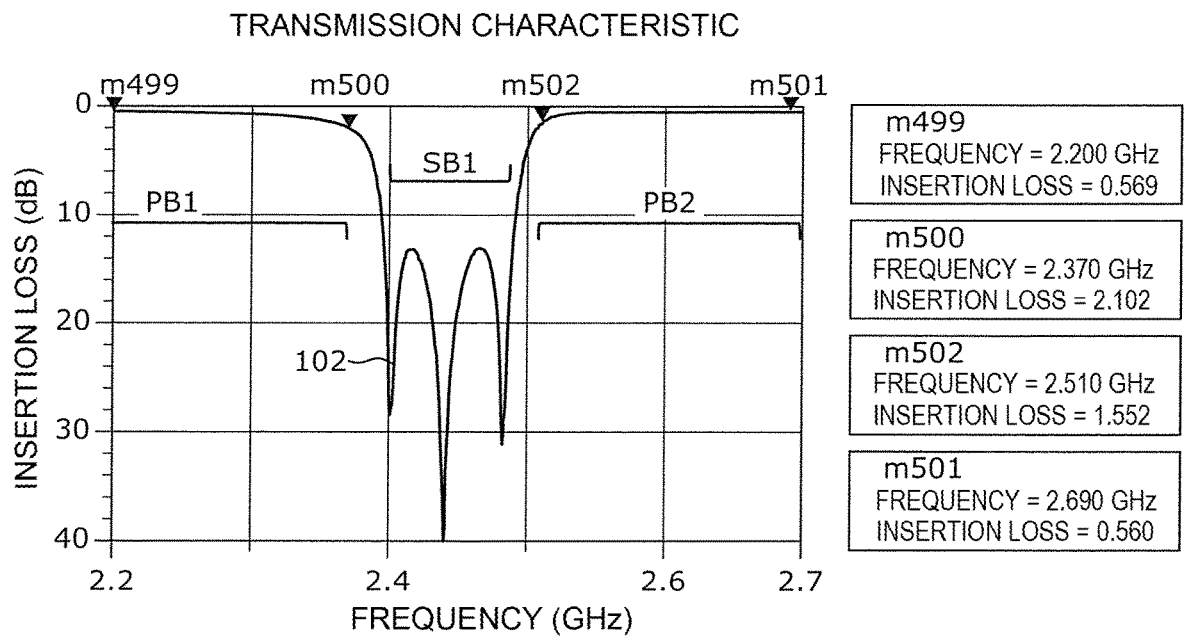
FIG. 3 is a graph illustrating a transmission characteristic of a filter device according to a comparative example.

FIG. 3 is a graph illustrating the transmission characteristic of the filter device 10X according to the comparative example. In FIG. 3, the horizontal axis represents the frequency, and the vertical axis represents the insertion loss. An insertion loss 102 indicates the frequency characteristic of the insertion loss in the filter device 10X according to the comparative example. As illustrated in FIG. 3, the filter device 10X according to the comparative example has the pass band PB1, the stop band SB1, and the pass band PB2 in ascending order of frequency, similarly to the filter device 10 according to the first embodiment.

The frequency and the insertion loss in marks m499, m500, m502, and m501 illustrated in FIG. 3 are as follows.
- m499 (2.200 GHz, 0.569 dB)
- m500 (2.370 GHz, 2.102 dB)
- m502 (2.510 GHz, 1.552 dB)
- m501 (2.690 GHz, 0.560 dB)

1.4 Circuit Configuration of Filter Device 10X

Next, a circuit configuration of the filter device 10X according to the comparative example having such a transmission characteristic will be described mainly with reference to FIG. 4, focusing on a difference from the filter device 10 according to the first embodiment.

Figure 4:
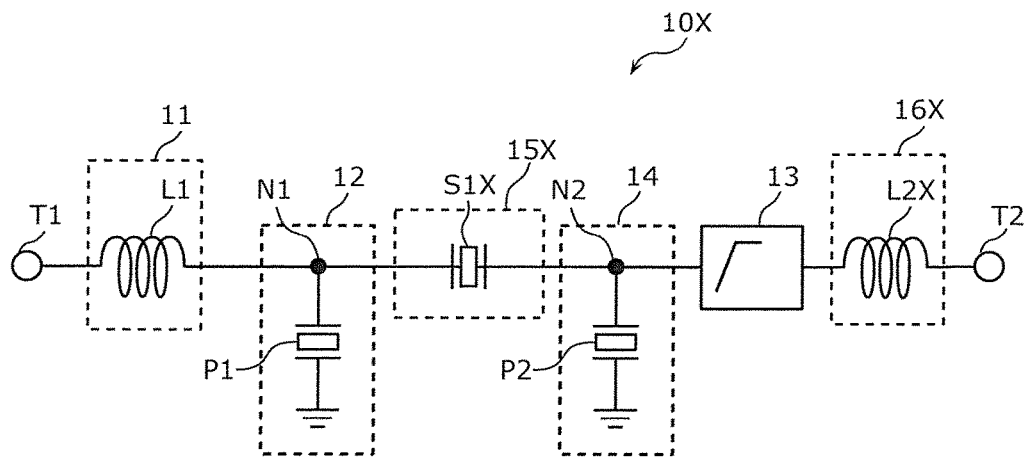
FIG. 4 is a circuit configuration diagram of the filter device according to the comparative example.

FIG. 4 is a circuit configuration diagram of the filter device 10X according to the comparative example. As illustrated in FIG. 4, the filter device 10X includes the input/output terminals T1 and T2, the matching circuit 11 and a matching circuit 16X, the resonance circuits 12 and 14, and a resonance circuit 15X, and the filter 13.

The resonance circuit 15X is constituted of a series arm resonator S1X. The series arm resonator S1X is arranged on a path connecting the node N1 and the node N2, and is connected in series to the matching circuit 11 and the filter 13.

The matching circuit 16X is constituted of an inductor L2X which is directly connected to the input/output terminal T2. Here, the inductor L2X is not shared with the resonance circuit 15X. The matching circuit 16X performs impedance matching between the circuit elements outside the filter device 10X and the circuit elements in the filter device 10X, which are connected via the input/output terminal T2.

1.5 Comparison of Filter Device 10 with Filter Device 10X

Next, various characteristics of the filter device 10 will be described while comparing the filter device 10 according to the first embodiment with the filter device 10X according to the comparative example.

1.5.1 Resonance Characteristic and Transmission Characteristic

First, a resonance characteristic and the transmission characteristic will be described with reference to FIG. 5A and FIG. 5B.

Figure 5A:
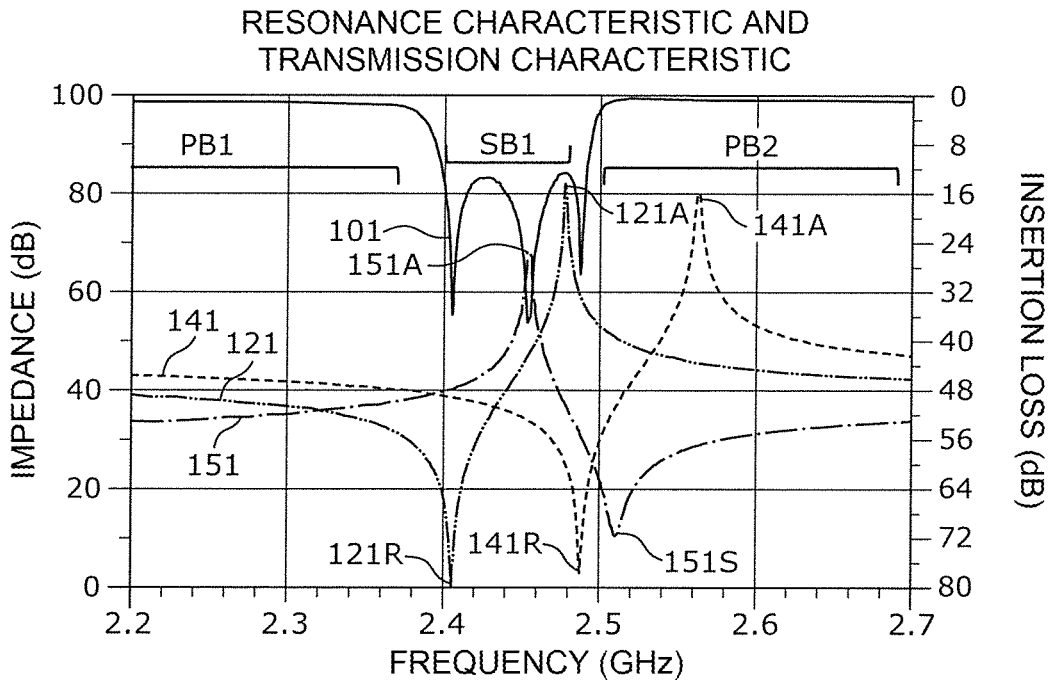
FIG. 5A is a graph illustrating a resonance characteristic and a transmission characteristic of the filter device according to the first embodiment.

FIG. 5A is a graph illustrating a resonance characteristic and the transmission characteristic of the filter device 10 according to the first embodiment. FIG. 5B is a graph illustrating a resonance characteristic and the transmission characteristic of the filter device 10X according to the comparative example. In FIG. 5A and FIG. 5B, the horizontal axis represents the frequency. The left vertical axis represents an impedance corresponding to a resonance waveform. The right vertical axis represents the insertion loss.

In FIG. 5A, resonance waveforms 121, 141, and 151 show resonance characteristics of the resonance circuits 12, 14, and 15 included in the filter device 10 according to the first embodiment, respectively. Similarly to FIG. 1, the insertion loss 101 indicates the frequency characteristic of the insertion loss of the filter device 10.

The resonance waveform 121 of the resonance circuit 12 has a resonance point 121R and an anti-resonance point 121A in the ascending order of the frequency. The resonance waveform 141 of the resonance circuit 14 has a resonance point 141R and an anti-resonance point 141A in the ascending order of the frequency. The resonance waveform 151 of the resonance circuit 15 has a resonance point (not illustrated for the lower frequency side than the frequency range of the graph), an anti-resonance point 151A, and a sub-resonance point 151S in the ascending order of the frequency.

The stop band SB1 is formed along an attenuation pole corresponding to the resonance point 121R, the anti-resonance point 151A, and the resonance point 141R. Here, among frequencies of the resonance point 121R, the anti-resonance point 151A, and the resonance point 141R, the frequency of the resonance point 121R is the lowest, and the frequency of the resonance point 141R is the highest. That is, the resonance point 121R forms an attenuation pole corresponding to the low frequency end of the stop band SB1, and the resonance point 141R forms an attenuation pole corresponding to the high frequency end of the stop band SB1.

The frequency of the sub-resonance point 151S (i.e., the sub-resonant frequency of the resonance circuit 15) is higher than the frequency of the resonance point 121R (i.e., the resonant frequency of the resonance circuit 12), and is higher than the frequency of the resonance point 141R (i.e., the resonant frequency of the resonance circuit 14). Such a sub-resonant frequency makes it possible to improve the steepness of the attenuation characteristic at the high frequency end of the stop band SB1.

It should be noted that the frequency of the sub-resonance point 151S can be within a range from 100% to 110% of the frequency of the resonance point 141R, and can be within a range from 100% to 105% of the frequency of the resonance point 141R. It was confirmed by an experiment that the steepness of the attenuation characteristic is remarkably improved at the high frequency end of the stop band SB1 by such a sub-resonant frequency.

Also, the frequency of the sub-resonance point 151S may be higher than the upper limit frequency (e.g., 2481.5 MHz) of the communication band (for example, WiFi® 2.4 GHz band) corresponding to the stop band SB1. For example, the frequency of the sub-resonance point 151S may be included in the range of 100% to 110% (for example, 2481.5 MHz to 2729.7 MHz) of the upper limit frequency of the communication band corresponding to the stop band SB1, and in particular, may be included in the range of 100% to 105% (for example, 2481.5 MHz to 2605.6 MHz). It was confirmed by experiment that, even at such a sub-resonant frequency, the steepness of the attenuation characteristic at the high frequency end of the stop band SB1 was remarkably improved.

Figure 5B:
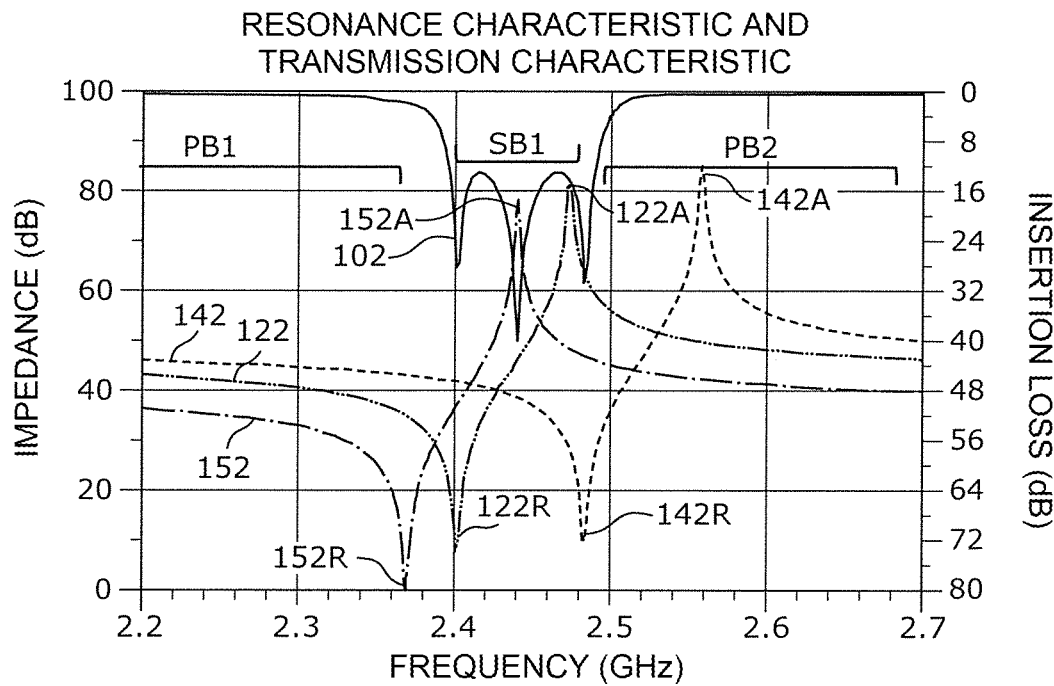
FIG. 5B is a graph illustrating a resonance characteristic and a transmission characteristic of the filter device according to the comparative example.

In FIG. 5B, resonant waveforms 122, 142, and 152 show resonance characteristics of the resonance circuits 12, 14, and 15X included in the filter device 10X according to the comparative example, respectively. Similarly to FIG. 3, the insertion loss 102 indicates the frequency characteristic of the insertion loss of the filter device 10X.

The resonance waveform 122 of the resonance circuit 12 has a resonance point 122R and an anti-resonance point 122A in the ascending order of the frequency. The resonance waveform 142 of the resonance circuit 14 has a resonance point 142R and an anti-resonance point 142A in the ascending order of the frequency. The resonance waveform 152 of the resonance circuit 15X has a resonance point 152R and an anti-resonance point 152A in the ascending order of the frequency.

The stop band SB1 is formed along the attenuation pole corresponding to the resonance point 122R, the anti-resonance point 152A, and the resonance point 142R. In the filter device 10X, the sub-resonance point of the resonance waveform 152 is not present at least in the frequency range of the graph.

In this manner, in the resonance waveforms 151 and 152, there is a large difference in the presence or absence of the sub-resonance point. Due to the difference in the sub-resonance point, there is a difference in the transmission characteristic between the filter device 10 and the filter device 10X at the low frequency end of the pass band PB2. Specifically, in the filter device 10, the insertion loss at the low frequency end (m502) of the pass band PB2 is 0.878 dB (refer to FIG. 1), but in the filter device 10X, the insertion loss at the low frequency end (m502) of the pass band PB2 is 1.552 dB (refer to FIG. 3). That is, in the filter device 10, the insertion loss decreases at the low frequency end of the pass band PB2 compared with the filter device 10X.

1.5.2 Reflection Characteristic

Next, the reflection characteristic will be described with reference to FIG. 6A and FIG. 6B.

Figure 6A:
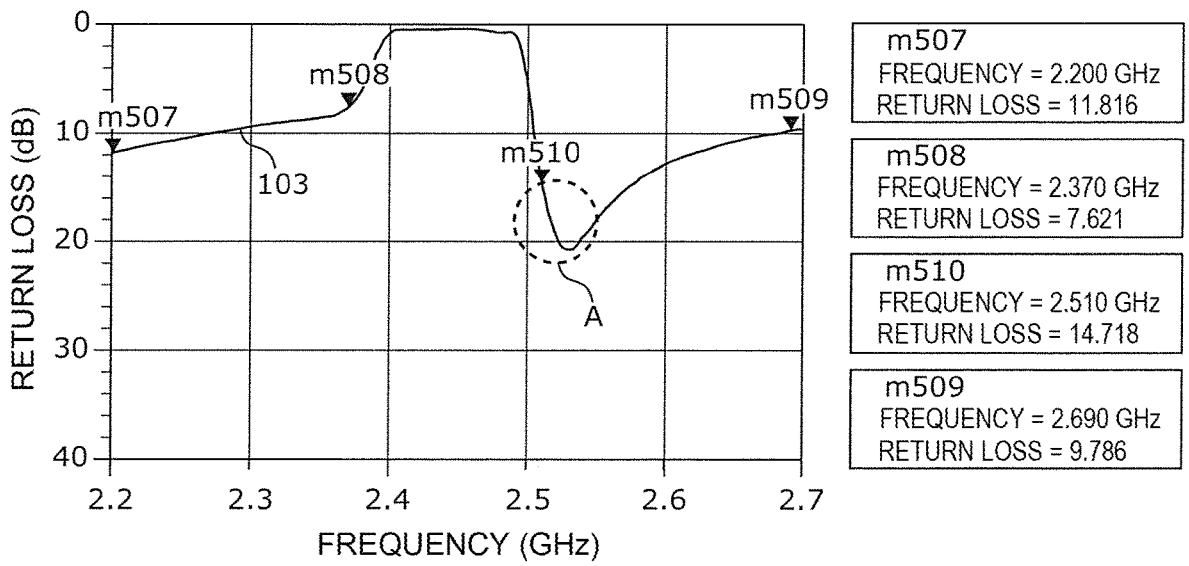
FIG. 6A is a graph illustrating a reflection characteristic of the filter device according to the first embodiment.

FIG. 6A is a graph illustrating a reflection characteristic of the filter device 10 according to the first embodiment. FIG. 6B is a graph illustrating a reflection characteristic of the filter device 10X according to the comparative example. Return losses 103 and 104 in FIGS. 6A and 6B show the frequency characteristics of the return loss at the input/output terminal T1. In FIG. 6A and FIG. 6B, the horizontal axis represents the frequency, and the vertical axis represents the return loss.

Note that the frequency and the return loss in marks m507, m508, m510 and m509 in FIG. 6A are as follows.
m507 (2.200 GHz, 11.816 dB)
m508 (2.370 GHz, 7.621 dB)
m510 (2.510 GHz, 14.718 dB)
m509 (2.690 GHz, 9.786 dB)

Figure 6B:
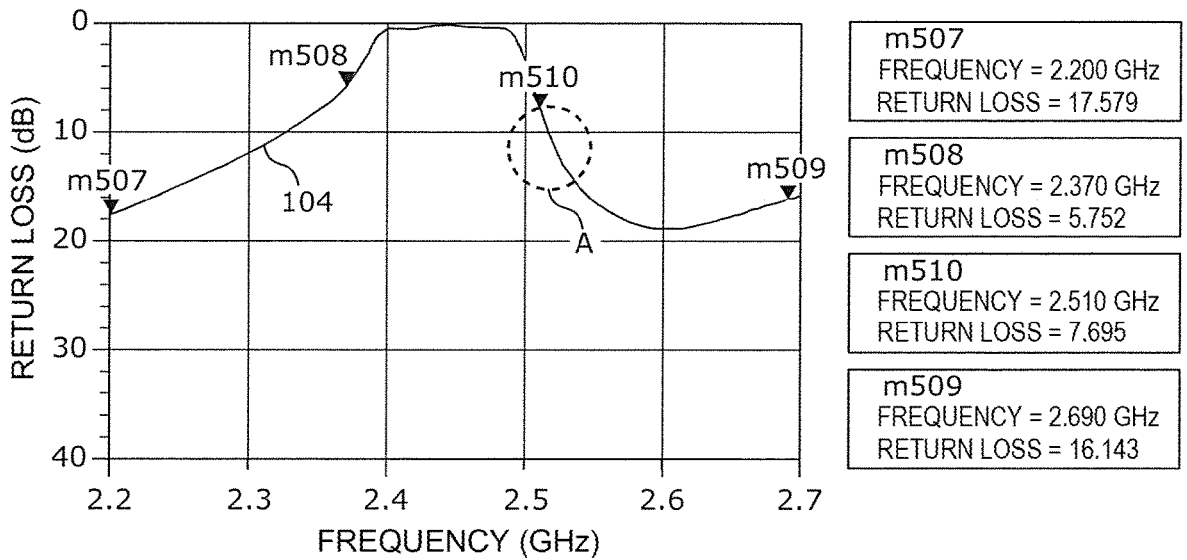
FIG. 6B is a graph illustrating a reflection characteristic of the filter device according to the comparative example.

On the other hand, the frequency and the return loss in marks m507, m508, m510 and m509 in FIG. 6B are as follows.
m507 (2.200 GHz, 17.579 dB)
m508 (2.370 GHz, 5.752 dB)
m510 (2.510 GHz, 7.695 dB)
m509 (2.690 GHz, 16.143 dB)

Referring to FIG. 6A and FIG. 6B, in the vicinity of the low frequency end of the pass band PB2 under a large influence of the sub-resonance point 151S (part A near 2.51 GHz), the return loss 103 of the filter device 10 is larger than the return loss 104 of the filter device 10X. From this, it can be seen that in the filter device 10, the return loss increases at the lower frequency end of the pass band PB2 (reflection signal is reduced) as compared with the filter device 10X, and the insertion loss is improved.

In addition, in the vicinity of the low frequency end of the pass band PB2, the return loss 103 in FIG. 6A is more steeply increased than the return loss 104 in FIG. 6B. From this, it can be seen that, in the filter device 10, a steeper attenuation characteristic than that of the filter device 10X is realized at the low frequency end of the pass band PB2.

1.6 Effects

As described above, according to the filter device 10 of the present embodiment, the resonance circuit 15 including the series arm resonator S1 and the inductor L2 can have a sub-resonant frequency that is higher than the resonant frequency of the resonance circuit 14 constituted of the parallel arm resonator P2. Therefore, the filter device 10 can reduce the insertion loss of the pass band PB2 located on the higher frequency side than the stop band SB1 by the sub-resonance point 151S of the resonance circuit 15. As a result, the filter device 10 can realize a steeper attenuation characteristic than the filter device 10X according to the comparative example at the low frequency end of the pass band PB2, that is, at the high frequency end of the stop band SB1.

Further, according to the filter device 10 of the present embodiment, the sub-resonant frequency of the resonance circuit 15 can be included in the range of 100% to 110% or 100% to 105% of the resonant frequency of the resonance circuit 14. Thus, it is possible to prevent the sub-resonance point 151S of the resonance circuit 15 from being excessively distant from the high frequency end of the stop band SB1 and the low frequency end of the pass band PB2. As a result, a steeper attenuation characteristic can be realized at the high frequency end of the stop band SB1, and the insertion loss at the low frequency end of the pass band PB2 can be effectively reduced.

In addition, according to the filter device 10 of the present embodiment, the inductor L2 directly connected to the input/output terminal T2 can be directly connected to the series arm resonator S1. Therefore, the inductor L2 can be shared by the resonance circuit 15 and the matching circuit 16, and the number of circuit elements can be reduced.

First Modification of First Embodiment

Next, a first modification of the first embodiment will be described. In this modification, a case where a filter included in the filter device is a high pass filter constituted of an acoustic wave resonator will be described.

Figure 7:
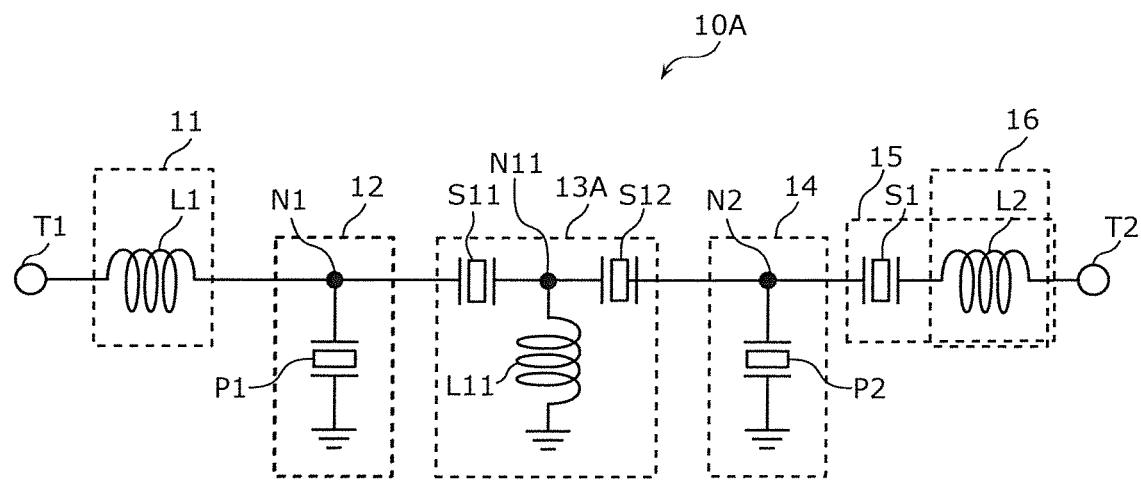
FIG. 7 is a circuit configuration diagram of a filter device according to a first modification of the first embodiment.

FIG. 7 is a circuit configuration diagram of a filter device 10A according to the first modification of the first embodiment. As illustrated in FIG. 7, the filter device 10A includes the input/output terminals T1 and T2, the matching circuits 11 and 16, the resonance circuits 12, 14 and 15, and a filter 13A.

The filter 13A is constituted of an acoustic wave resonator and is disposed on a path connecting the node N1 and the node N2. The filter 13A is a high pass filter having pass bands including the pass bands PB1 and PB2. That is, the filter 13A is a high pass filter having a cutoff frequency equal to or lower than the lower limit frequency (for example, 1710 MHz) of the pass band PB1.

Specifically, the filter 13A includes series arm resonators S11 and S12, and an inductor L11. The series arm resonators S11 and S12 are arranged on a path connecting the node N1 and the node N2, and are connected in series to the inductor L1 and the series arm resonator S1. Inductor L11 is connected between the node N11 on a path connecting the series arm resonator S11 and the series arm resonator S12, and the ground.

As the series arm resonators S11 and S12, similar to the parallel arm resonators P1 and P2 and the series arm resonators S1, the acoustic wave resonators can be used. For example, as the series arm resonators S11 and S12, a SAW resonator, a BAW resonator, a FBAR, or the like can be used.

As described above, according to the filter device 10A of this modification, a filter constituted of the acoustic wave resonator can be used as the filter 13A. Therefore, a steep attenuation characteristic can be realized even at the low frequency end of the pass band PB1.

Second Modification of First Embodiment

Next, a second modification of the first embodiment will be described. In this modification, a case where the filter included in the filter device is an LC high pass filter will be described.

Figure 8:
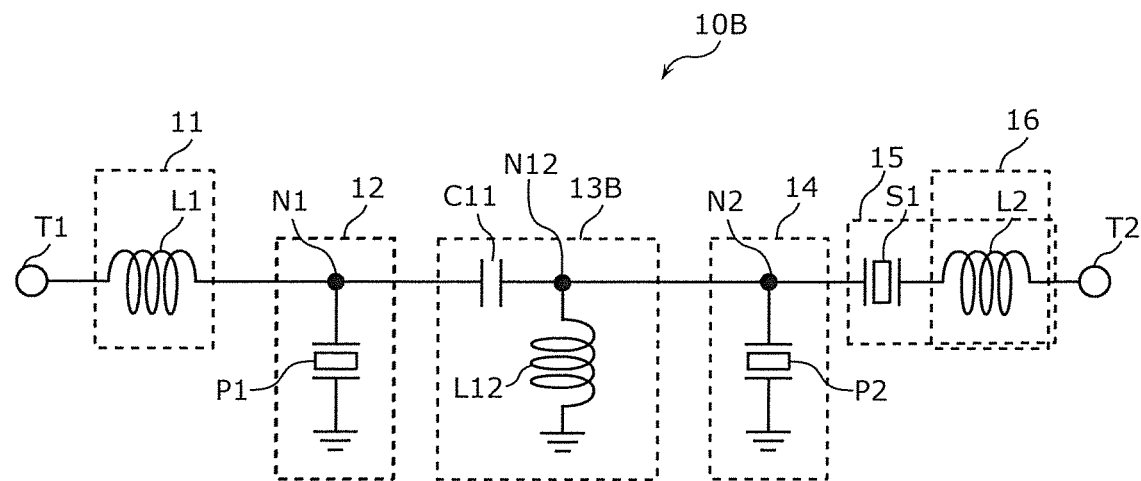
FIG. 8 is a circuit configuration diagram of a filter device according to a second modification of the first embodiment.

FIG. 8 is a circuit configuration diagram of a filter device 10B according to a second modification of the first embodiment. As illustrated in FIG. 8, the filter device 10B includes the input/output terminals T1 and T2, the matching circuits 11 and 16, the resonance circuits 12, 14, and 15, and a filter 13B.

The filter 13B is an LC filter disposed on a path connecting the node N1 and the node N2. The filter 13B is a high pass filter having pass bands including the pass bands PB1 and PB2. That is, the filter 13B is a high pass filter having a cutoff frequency equal to or lower than the lower limit frequency (for example, 1710 MHz) of the pass band PB1.

Specifically, the filter 13B includes a capacitor C11 and an inductor L12. The capacitor C11 is disposed on a path connecting the node N1 and the node N2, and is connected in series to the inductor L1 and the series arm resonator S1. The inductor L12 is connected between the node N12 on a path connecting the capacitor C11 and the series arm resonator S1, and the ground.

As described above, according to the filter device 10B of this modification, an LC filter can be used as the filter 13B. Therefore, the filter 13B can easily realize a broadband pass band including the pass band PB1 and the pass band PB2.

Second Embodiment

Next, a description will be given of a second embodiment. the present embodiment differs from the first embodiment in that the inductor is connected in parallel to the parallel arm resonator P1 in order to improve the transmission characteristic in a high frequency region of the pass band PB2. Hereinafter, the present embodiment will be described in detail with reference to the drawings, focusing on differences from the first embodiment described above.

2.1 Circuit Configuration of Filter Device 10C

First, a circuit configuration of a filter device 10C according to the present embodiment will be described with reference to FIG. 9.

Figure 9:
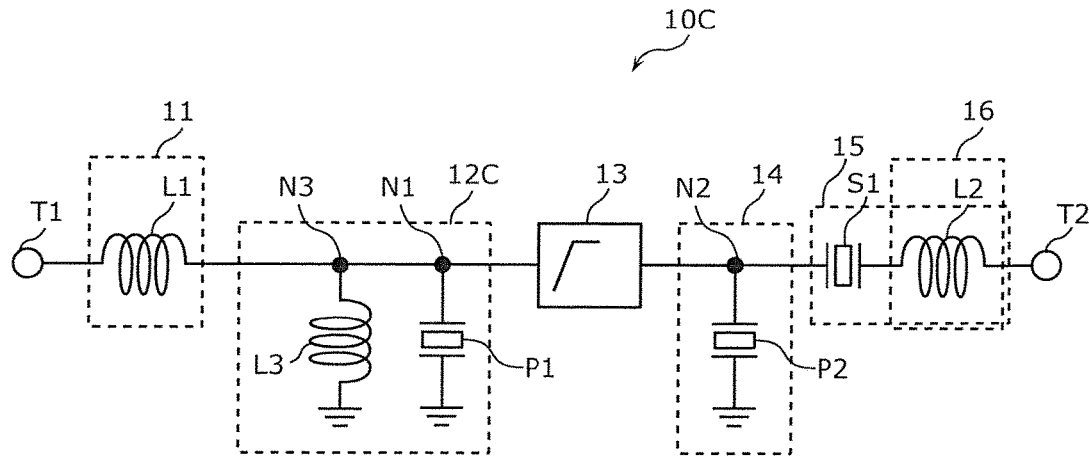
FIG. 9 is a circuit configuration diagram of a filter device according to a second embodiment.

FIG. 9 is a circuit configuration diagram of the filter device 10C according to the second embodiment. As illustrated in FIG. 9, the filter device 10C includes the input/output terminals T1 and T2, the matching circuits 11 and 16, a resonance circuit 12C and the resonance circuits 14 and 15, and the filter 13.

The resonance circuit 12C is an example of a third resonance circuit, and is constituted of the parallel arm resonator P1 and an inductor L3. The resonance characteristic of the resonance circuit 12C will be described later with reference to FIG. 11.

The inductor L3 is an example of a second inductor, and is connected in parallel to the parallel arm resonator P1.

Specifically, the inductor L3 is connected between a node N3 on a path connecting the inductor L1 and the node N1, and the ground.

2.2 Transmission Characteristic of Filter Device 10C

Next, a transmission characteristic of the filter device 10C according to the present embodiment will be described with reference to FIG. 10.

Figure 10:
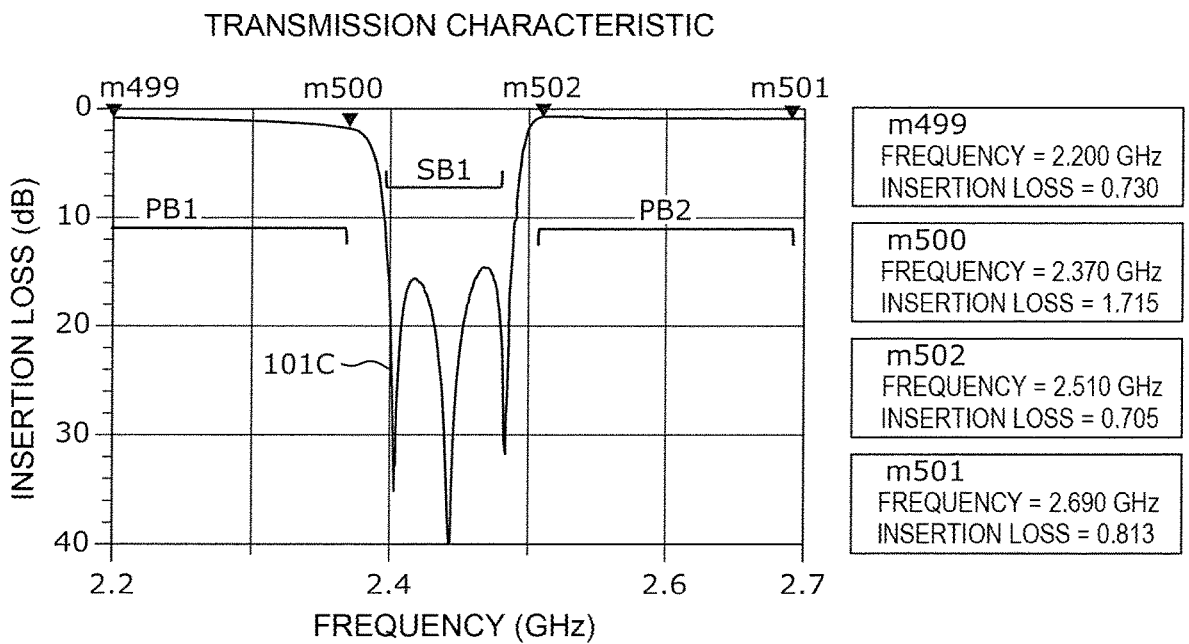
FIG. 10 is a graph illustrating a transmission characteristic of the filter device according to the second embodiment.

FIG. 10 is a graph illustrating the transmission characteristic of the filter device 10C according to the second embodiment. In FIG. 10, the horizontal axis represents the frequency, and the vertical axis represents the insertion loss. An insertion loss 101C indicates the frequency characteristic of the insertion loss in the filter device 10C. As illustrated in FIG. 10, the filter device 10C has the pass band PB1, the stop band SB1, and the pass band PB2 in ascending order of frequency, similarly to the filter device 10 according to the first embodiment.

The frequency and the insertion loss in marks m499, m500, m502 and m501 illustrated in FIG. 10 are as follows.
m499 (2.200 GHz, 0.730 dB)
m500 (2.370 GHz, 1.715 dB)
m502 (2.510 GHz, 0.705 dB)
m501 (2.690 GHz, 0.813 dB)

Comparing FIG. 10 and FIG. 1, it can be seen that in the filter device 10C according to the present embodiment, the insertion loss is decreased in the pass band PB2 (m502, m501).

2.3 Resonance Characteristic of Filter Device 10C

Next, the resonance characteristic of the filter device 10C according to the present embodiment will be described with reference to FIG. 11.

Figure 11:
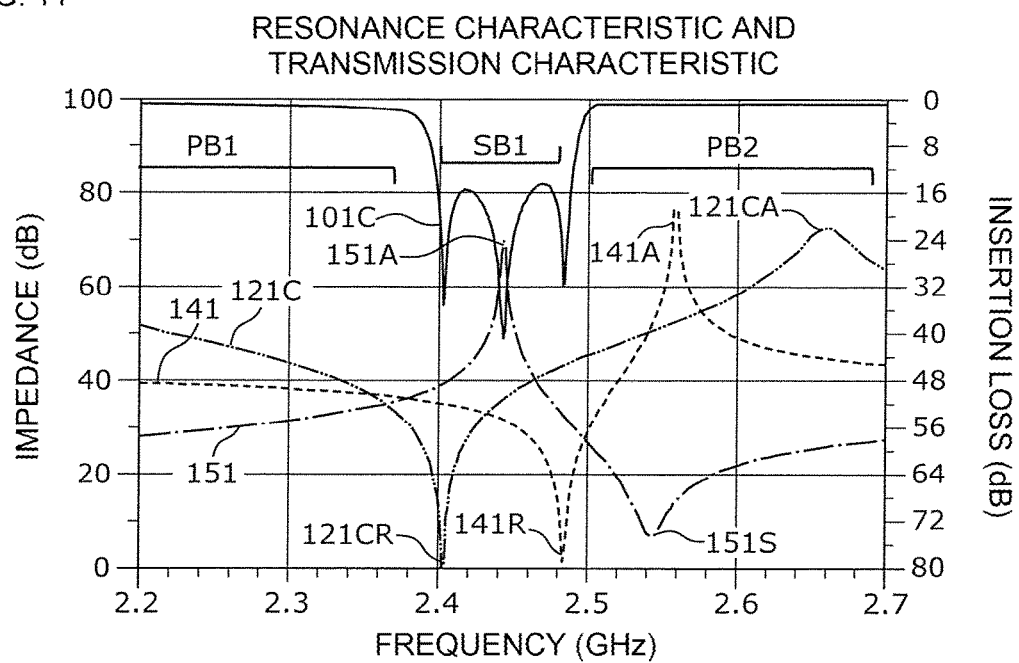
FIG. 11 is a graph illustrating a resonance characteristic and a transmission characteristic of the filter device according to the second embodiment.

FIG. 11 is a graph illustrating a resonance characteristic and a transmission characteristic of the filter device 10C according to the second embodiment. In FIG. 11, the horizontal axis represents the frequency. The left vertical axis represents an impedance corresponding to a resonance waveform. The right vertical axis represents an insertion loss.

A resonance waveform 121C and the resonance waveforms 141 and 151 respectively show resonance characteristics of the resonance circuits 12C, 14, and 15 included in the filter device 10C according to the present embodiment. Similarly to FIG. 10, the insertion loss 101C indicates the frequency characteristic of the insertion loss of the filter device 10C.

The resonance waveform 121C of the resonance circuit 12C has a resonance point 121CR and an anti-resonance point 121CA in the ascending order of the frequency.

In FIG. 11, the anti-resonance point 121CA is moved to the higher frequency side than the anti-resonance point 121A in FIG. 5A. As a result, the frequency of the anti-resonance point 121CA (i.e., the anti-resonant frequency of the resonance circuit 12C) is higher than the frequency of the resonance point 141R (i.e., the resonant frequency of the resonance circuit 14), and is included in the pass band PB2.

2.4 Reflection Characteristic of Filter Device 10C

Next, a reflection characteristic of the filter device 10C according to the present embodiment will be described with reference to FIG. 12.

Figure 12:
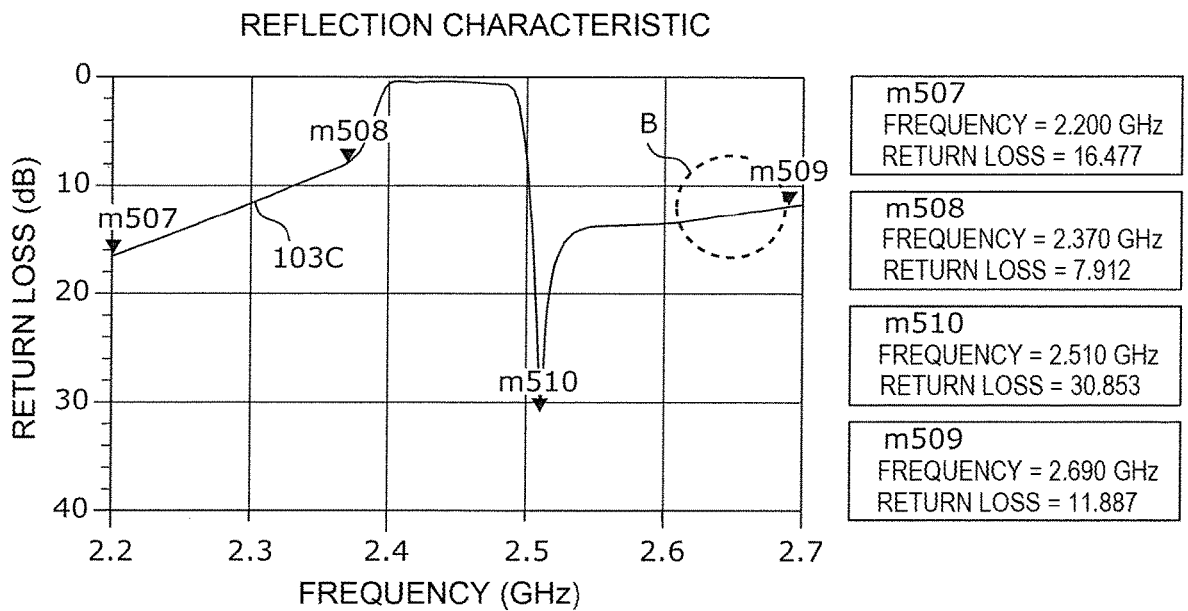
FIG. 12 is a graph illustrating a reflection characteristic of the filter device according to the second embodiment.

FIG. 12 is a graph illustrating a reflection characteristic of the filter device 10C according to the second embodiment. In FIG. 12, a return loss 103C indicates a frequency characteristic of a return loss at the input/output terminal T1. In FIG. 12, the horizontal axis represents the frequency, and the vertical axis represents the return loss.

The frequency and the return loss in the marks m507, m508, m510 and m509 shown in FIG. 12 are as follows.

m507 (2.200 GHz, 16.477 dB)
m508 (2.370 GHz, 7.912 dB)
m510 (2.510 GHz, 30.853 dB)
m509 (2.690 GHz, 11.887 dB)

Comparing FIG. 12 and FIG. 6A, the return loss 103C in FIG. 12 is larger than the return loss 103 in FIG. 6A in the high frequency region (part B) of the pass band PB2 where the influence of the anti-resonance point 121CA is large. That is, since the anti-resonance point 121CA has moved into the pass band PB2, it can be seen that in the filter device 10C according to the present embodiment, the return loss is increased (reflection signal is reduced) in the high frequency region of the pass band PB2, and the insertion loss is reduced in comparison with the filter device 10 according to the first embodiment.

2.5 Effects

As described above, according to the filter device 10C of the present embodiment, the inductor L3 connected in parallel to the parallel arm resonator P1 can be provided. Thus, the anti-resonant frequency of the resonance circuit 12C constituted of the parallel arm resonator P1 and the inductor L3 can be made higher than the resonant frequency of the resonance circuit 14, and can be moved into the pass band PB2. As a result, the insertion loss in the pass band PB2 can be decreased.

Third Embodiment

Next, a description will be given of a third embodiment. In the present embodiment, a description will be given of a multiplexer and a communication device using a filter device in which the filter device 10A according to the first modification of the first embodiment and the filter device 10C according to the second embodiment are combined with each other.

3.1 Circuit Configuration of Filter Device 10D

First, a circuit configuration of a filter device 10D according to the present embodiment will be described with reference to FIG. 13.

Figure 13:
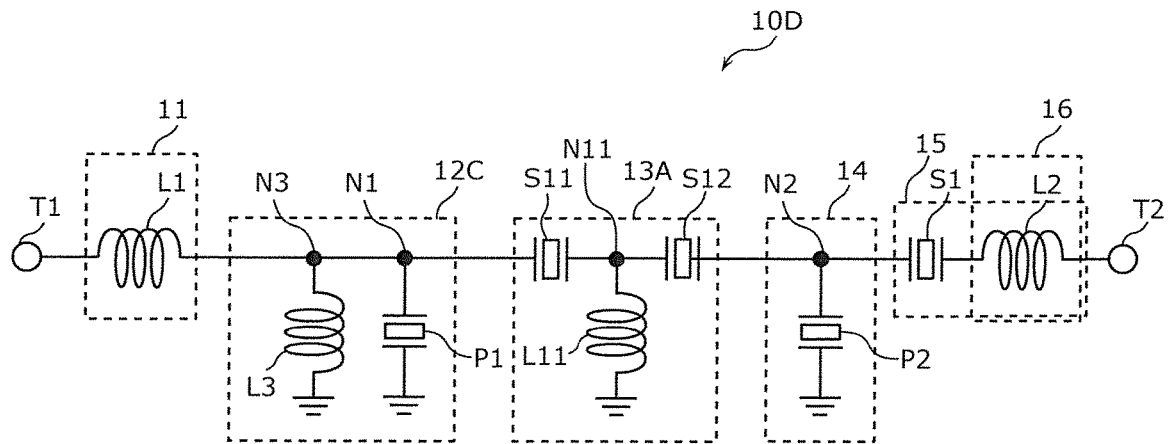
FIG. 13 is a circuit configuration diagram of a filter device according to a third embodiment.

FIG. 13 is a circuit configuration diagram of the filter device 10D according to the third embodiment. As illustrated in FIG. 13, the filter device 10D includes the input/output terminals T1 and T2, the matching circuits 11 and 16, the resonance circuits 12C, 14, and 15, and the filter 13A.

3.2 Transmission Characteristic of Filter Device 10D

Next, a transmission characteristic of the filter device 10D according to the present embodiment will be described with reference to FIG. 14.

Figure 14:
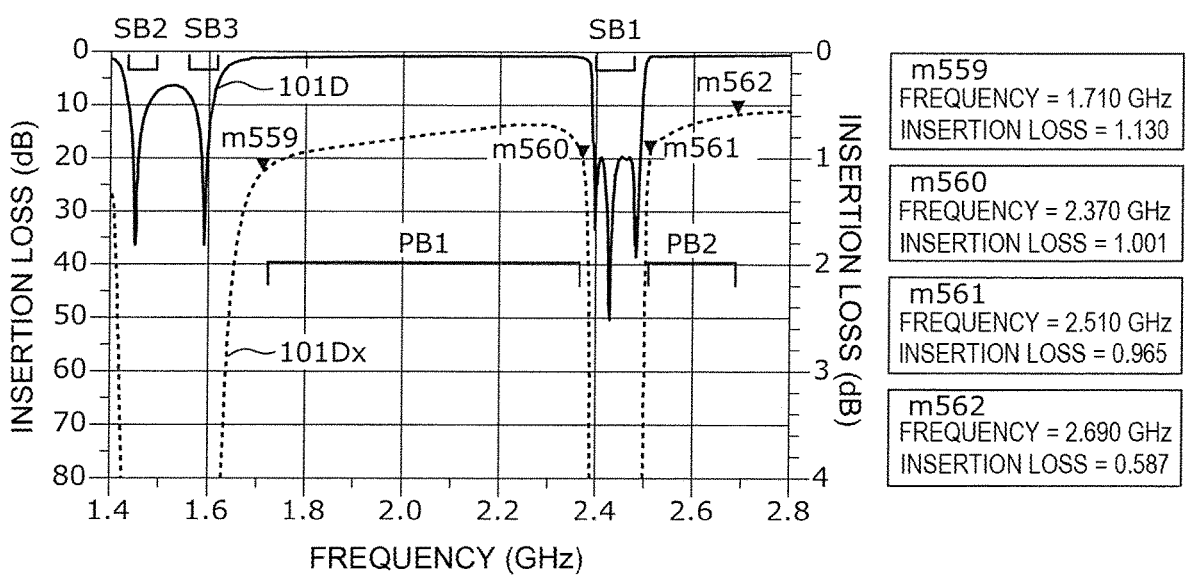
FIG. 14 is a graph illustrating a transmission characteristic of the filter device according to the third embodiment.

FIG. 14 is a graph illustrating the transmission characteristic of the filter device 10D according to the third embodiment. In FIG. 14, the horizontal axis represents the frequency, and the left vertical axis and the right vertical axis represent the insertion loss. An insertion loss 101D indicates the frequency characteristic of the insertion loss in the filter device 10D, and corresponds to the left vertical axis. An insertion loss 101Dx is an enlarged view in the vicinity of 0 dB of the insertion loss 101D, and corresponds to the right vertical axis.

As illustrated in FIG. 14, the filter device 10D has a stop band SB2, a stop band SB3, the pass band PB1, the stop band SB1, and the pass band PB2 in the ascending order of the frequency. The stop band SB2 corresponds to a communication band of equal to or higher than 1428 MHz and equal to or lower than 1511 MHz, and is mainly formed by the series arm resonator S11. The stop band SB3 corresponds to a communication band of equal to or higher than 1559 MHz and equal to or lower than 1608 MHz, and is mainly formed by the series arm resonator S12.

The frequency and the insertion loss in marks m559, m560, m561 and m562 illustrated in FIG. 14 are as follows.

m559 (1.710 GHz, 1.130 dB)
m560 (2.370 GHz, 1.001 dB)
m561 (2.510 GHz, 0.965 dB)
m562 (2.690 GHz, 0.587 dB)

3.3 Circuit Configuration of Multiplexer 1 and Communication Device 5

Figure 15:
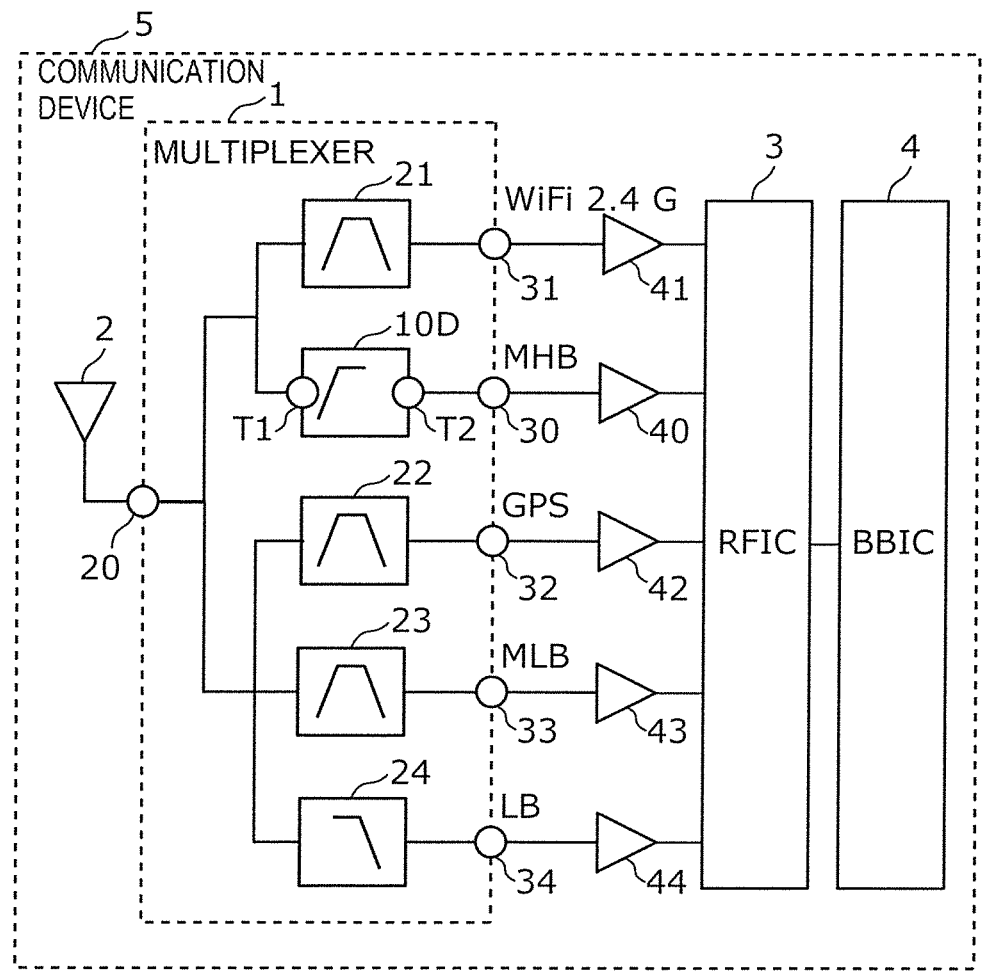
FIG. 15 is a circuit configuration diagram of a communication device equipped with a multiplexer according to the third embodiment.

Next, the circuit configuration of a multiplexer 1 and a communication device 5 including the filter device 10D configured as described above will be described. FIG. 15 is a circuit configuration diagram of the communication device 5 including the multiplexer 1 according to the third embodiment.

As illustrated in FIG. 15, the communication device 5 includes the multiplexer 1, an antenna element 2, an RF signal processing circuit (RFIC) 3, a baseband signal processing circuit (BBIC) 4, and reception low noise amplifiers 40 to 44.

The RFIC 3 is an RF signal processing circuit for processing a high-frequency signal transmitted and received by the antenna element 2. Specifically, the RFIC 3 performs signal processing on a high-frequency reception signal input via a reception path of the multiplexer 1 by down-converting or the like, and outputs the reception signal generated by the signal processing to the BBIC 4.

The BBIC 4 is a circuit that performs signal processing by using an intermediate frequency band having a lower frequency than that of the high-frequency signal propagating through the multiplexer 1. The signal processed in the BBIC 4 is used, for example, as an image signal for image display, or as a voice signal for communication via a speaker.

The antenna element 2 is connected to a common terminal 20 of the multiplexer 1, receives a high-frequency signal from the outside, and outputs the high-frequency signal to the multiplexer 1.

Each of the reception low noise amplifiers 40 to 44 amplifies the high-frequency signal input from output terminals 30 to 34 of the multiplexer 1 with low noise. Each of the reception low noise amplifiers 40 to 44 is, for example, a low noise amplifier. The high-frequency signal amplified by the reception low noise amplifiers 40 to 44 is output to the RFIC 3.

In one embodiment, the antenna element 2 and the BBIC 4 are not necessarily essential components for the communication device according to the present disclosure.

Next, the circuit configuration of the multiplexer 1 will be described.

As illustrated in FIG. 15, the multiplexer 1 includes the common terminal 20, the filter device 10D and filter devices 21 to 24 each connected to the common terminal 20, and the output terminals 30 to 34.

The common terminal 20 is connected to the antenna element 2. The filter device 10D is disposed on a path connecting the common terminal 20 and the output terminal 30, and passes a high-frequency signal of the MHB (equal to or higher than 1710 MHz and equal to or lower than 2370 MHz and equal to or higher than 2510 MHz and equal to or lower than 2690 MHz) out of the high-frequency signals input from the common terminal 20. A BAW resonator, for example, is used as the resonator of the filter device 10D.

The filter device 21 is disposed on a path connecting the common terminal 20 and the output terminal 31, and passes a high-frequency signal of the WiFi® 2.4 GHz band (equal to or higher than 2402 MHz and equal to or lower than 2481.5 MHz) out of the high-frequency signals input from the common terminal 20. That is, the filter device 21 is a band pass filter having a pass band corresponding to the WiFi® 2.4 GHz band. For example, an acoustic wave filter using a BAW resonator is used as the filter device 21.

The filter device 22 is disposed on a path connecting the common terminal 20 and the output terminal 32, and passes a high-frequency signal of a global positioning system (GPS) band (equal to or higher than 1559 MHz and equal to or lower than 1608 MHz) out of the high-frequency signals input from the common terminal 20. That is, the filter device 22 is a band pass filter having a pass band corresponding to the GPS band. For example, an acoustic wave filter using a BAW resonator is used as the filter device 22.

The filter device 23 is disposed on a path connecting the common terminal 20 and the output terminal 33, and passes a high-frequency signal of a middle low band (MLB) (equal to or higher than 1428 MHz and equal to or lower than 1511 MHz) out of the high-frequency signals input from the common terminal 20. That is, the filter device 23 is a band pass filter having a pass band corresponding to the MLB. An FBAR filter, for example, is used as the filter device 23.

The filter device 24 is disposed on a path connecting the common terminal 20 and the output terminal 34, and passes a high-frequency signal of a low band (LB) (equal to or higher than 690 MHz and equal to or lower than 960 MHz) out of the high-frequency signals input from the common terminal 20. That is, the filter device 24 is a low pass filter having a pass band corresponding to the LB. For example, an LC filter is used as the filter device 24.

Note that the filter devices 21 to 24 may be any one of a SAW filter, an acoustic wave filter using a BAW, an FBAR filter, an LC filter, and a dielectric filter, and is not limited thereto.

3.4 Transmission Characteristic of Multiplexer 1

Figure 16:
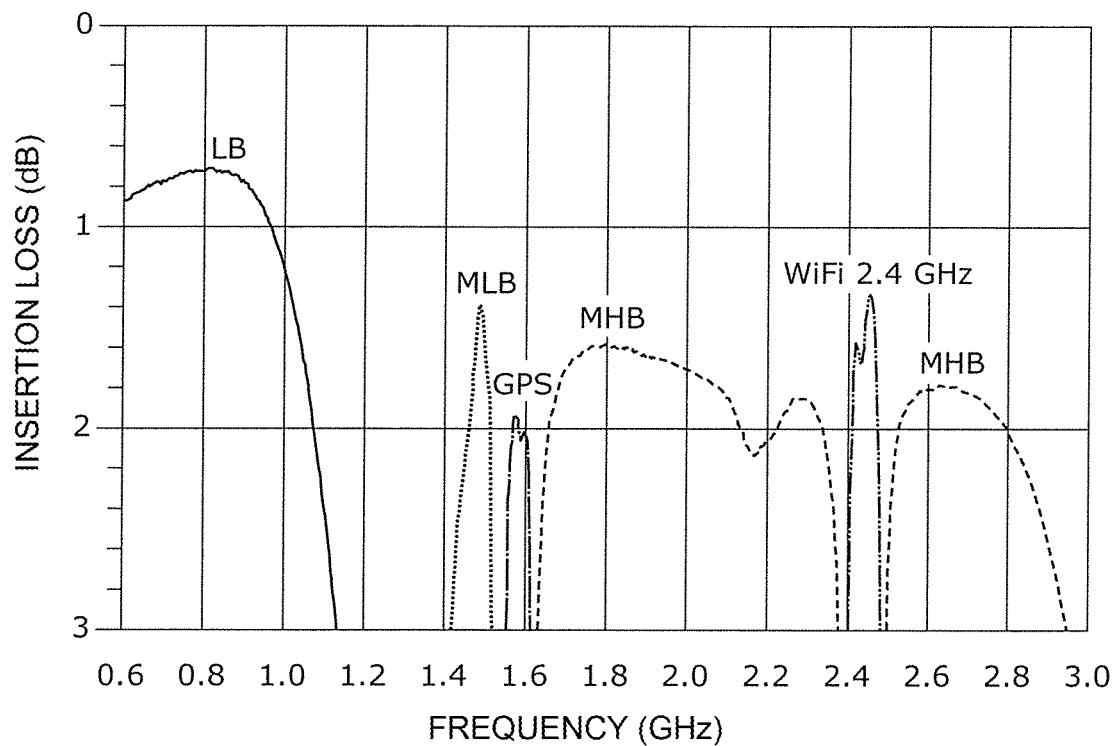
FIG. 16 is a graph illustrating a transmission characteristic of the multiplexer according to the third embodiment.

Next, a transmission characteristic of the multiplexer 1 configured as described above will be described. FIG. 16 is a graph illustrating the transmission characteristic of the multiplexer 1 according to the third embodiment. In FIG. 16, the horizontal axis represents the frequency, and the vertical axis represents the insertion loss.

From FIG. 16, it can be seen that the multiplexer 1 forms pass bands corresponding to a plurality of communication bands (LB, MLB, GPS, MHB, and WiFi® 2.4 GHz).

3.5 Effects

As described above, according to the multiplexer 1 of the present embodiment, by using the filter device 10D having the stop band corresponding to the WiFi® 2.4 GHz band within the pass band corresponding to the MHB, the high-frequency signals of a plurality of communication bands including the MHB and WiFi® 2.4 GHz bands can be divided into the respective communication bands.

Other Embodiments

Although the filter device and the multiplexer according to the embodiment of the present disclosure have been described with reference to the embodiments and modifications thereof, the filter device and the multiplexer according to the present disclosure are not limited to the above embodiments and modifications thereof. Further another embodiment realized by combining arbitrary constituent elements in the above embodiments and modifications thereof, modifications obtained by carrying out various variations that will occur to those skilled in the art without necessarily departing from the gist of the present disclosure with respect to the above embodiments and modifications thereof, and various apparatuses including the filter device and the multiplexer are also included in the present disclosure.

For example, in the filter device, the multiplexer and the communication device according to the embodiments and the modifications thereof, another circuit element and another wiring may be inserted between the circuit elements disclosed in the drawings and the paths connecting the signal paths. For example, the multiplexer 1 according to the third embodiment may be provided with one or more switches for switching between the conduction and non-conduction between the common terminal 20 and each filter device on a path connecting the common terminal 20 and the filter devices 10D and 21 to 24.

In the above embodiments and modifications thereof, the inductor L2 directly connected to the series arm resonator S1 in series is directly connected to the input/output terminal T2 and shared by the resonance circuit 15 and the matching circuit 16, but the present disclosure is not limited to this configuration. For example, the filter device may include an inductor directly connected to the series arm resonator S1 in series, separately from the inductor L2 constituting the matching circuit 16. Such a filter device 10E will be described with reference to FIG. 17.

Figure 17:
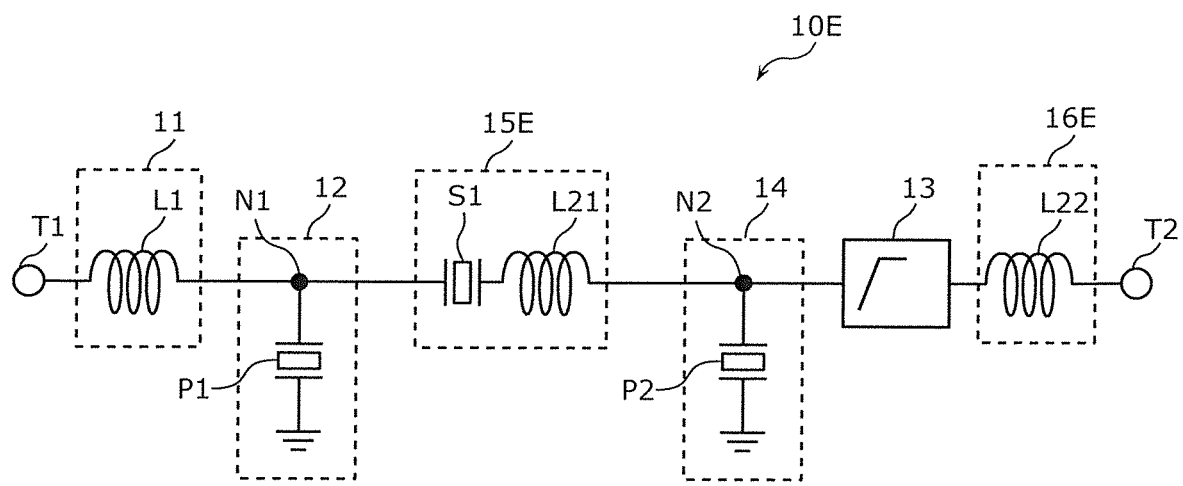
FIG. 17 is a circuit configuration diagram of a filter device according to another embodiment.

FIG. 17 is a circuit configuration diagram of the filter device 10E according to another embodiment. As illustrated in FIG. 17, the filter device 10E includes the input/output terminals T1 and T2, the matching circuit 11 and a matching circuit 16E, the resonance circuits 12 and 14, and a resonance circuit 15E, and the filter 13.

The resonance circuit 15E is an example of the second resonance circuit, and is constituted of the series arm resonator S1 and an inductor L21.

The series arm resonator S1 and the inductor L21 are arranged on a path connecting the node N1 and the node N2. The series arm resonator S1 is directly connected to the inductor L21 in series.

The matching circuit 16E is constituted of an inductor L22 which is directly connected to the input/output terminal T2. Here, the inductor L22 of the matching circuit 16E is not included in the resonance circuit 15E. The matching circuit 16E performs impedance matching between the circuit elements outside the filter device 10E and the circuit elements in the filter device 10E, which are connected to each other via the input/output terminal T2.

Even when the filter device 10E is configured as described above, the sub-resonant frequency of the resonance circuit 15E can be made higher than the resonant frequency of the resonance circuit 14E, so that a steep attenuation characteristic can be achieved at the high frequency end of the stop band SB1. In one embodiment, in the filter device 10E, the inductor L1, the parallel arm resonator P1, and the inductor L22 are not necessarily essential components for the filter device according to the present disclosure.

In each of the above embodiments and modifications thereof, the filter included in the filter device is a high pass filter, but the present disclosure is not limited thereto. The filter may be a low pass filter or a band pass filter.

Although the communication band corresponding to the pass band and/or the stop band of the filter device has been specifically described in the above embodiments and modifications thereof, these communication bands are illustrative and not limited thereto.

In each of the above embodiments and modifications thereof, the filter device forms a narrow-band stop band within a broadband pass band, but is not limited thereto. For example, the filter device may form a stop band at the low frequency end of the pass band of the LC high pass filter or LC band pass filter. In this case, the filter device can improve the attenuation characteristic at the low frequency end of the broadband pass band.

In the third embodiment, although the multiplexer is used in a reception circuit, the multiplexer may be used in a transmission circuit. In this case, the communication device may include a transmission power amplifier instead of the reception low noise amplifier. Also, the multiplexer may be used in the transmission/reception circuit. In this case, the communication device may include both of the reception low noise amplifier and the transmission power amplifier.

In the above third embodiment, the multiplexer includes five filter devices, but the number of filter devices is not limited to this. The multiplexer may include any one of the filter devices according to the above embodiments and modifications thereof, and other one or more filter devices, and the number of other one or more filter devices is not particularly limited.

In the third embodiment, a plurality of reception low noise amplifiers is connected to the filter device in a one-to-one manner, but the present disclosure is not limited thereto. One common reception low noise amplifier may be connected to some filter devices. In this case, the communication device may include a switch for switching between the conduction and the non-conduction of the reception low noise amplifier shared with each of the filter devices.

INDUSTRIAL APPLICABILITY

The present disclosure can be applied to a filter device and a multiplexer which are arranged in a multiband supported front end unit, and can be widely used for communication devices such as a cellular phone including the filter device and the multiplexer.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A filter device that has a first pass band and a first stop band on a lower frequency side than the first pass band, comprising:
   a filter having a pass band including the first pass band;
   a series arm resonator connected in series to the filter;
   a first inductor directly connected in series to the series arm resonator; and
   a first parallel arm resonator connected between a first node on a path connecting the filter and the series arm resonator, and the ground,
   wherein the first parallel arm resonator constitutes a first resonance circuit having a resonant frequency at which an attenuation pole corresponding to the first stop band is formed, and
   the series arm resonator and the first inductor constitute a second resonance circuit having an anti-resonant frequency on a lower frequency side than the first pass band and a sub-resonant frequency higher than a resonant frequency of the first resonance circuit.

2. The filter device according to claim 1,
wherein the sub-resonant frequency of the second resonance circuit is included in a range of 100% to 110% of the resonant frequency of the first resonance circuit.

3. The filter device according to claim 2,
wherein the sub-resonant frequency of the second resonance circuit is included in a range of 100% to 105% of the resonant frequency of the first resonance circuit.

4. The filter device according to claim 1,
wherein the filter, the series arm resonator and the first inductor are disposed on a path connecting a first input/output terminal and a second input/output terminal, and
the first inductor is directly connected to the first input/output terminal or the second input/output terminal.

5. The filter device according to claim 1, further comprising a second parallel arm resonator connected between a second node on a path connecting a first input/output terminal and a second input/output terminal,
wherein:
the filter, the series arm resonator, and the first inductor are disposed on the path connecting the first input/output terminal and the second input/output terminal,
the second parallel arm resonator constitutes a third resonance circuit having a resonant frequency on a lower frequency side than the first pass band, and
a sub-resonant frequency of the second resonance circuit is higher than the resonant frequency of the third resonance circuit.

6. The filter device according to claim 5,
wherein the filter is disposed on a path connecting the first node and the second node.

7. The filter device according to claim 6,
further comprising a second inductor connected in parallel to the second parallel arm resonator, wherein:
the third resonance circuit comprises the second inductor and the second parallel arm resonator, and
an anti-resonant frequency of the third resonance circuit is higher than a resonant frequency of the first resonance circuit.

8. The filter device according to claim 5,
further comprising a second inductor connected in parallel to the second parallel arm resonator, wherein:
the third resonance circuit comprises the second inductor and the second parallel arm resonator, and
an anti-resonant frequency of the third resonance circuit is higher than a resonant frequency of the first resonance circuit.

9. The filter device according to claim 1,
wherein the filter is an acoustic wave resonator.

10. The filter device according to claim 1,
wherein the filter is an LC filter.

11. The filter device according to claim 1,
wherein the filter device has a second pass band on a lower frequency side than the first stop band,
the second pass band corresponds to a communication band of equal to or higher than 1710 MHz and equal to or lower than 2370 MHz,
the first stop band corresponds to a communication band of equal to or higher than 2402 MHz and equal to or lower than 2481.5 MHz, and
the first pass band corresponds to a communication band of equal to or higher than 2510 MHz and equal to or lower than 2690 MHz.

12. A multiplexer comprising:
the filter device according to claim 1; and
at least one other filter device, wherein the filter device and the at least one other filter device are connected to a common terminal.

13. The multiplexer according to claim 12,
wherein the filter device further has a second pass band, a second stop band, and a third stop band, the second stop band corresponds to a communication band of equal to or higher than 1428 MHz and equal to or less than 1511 MHz, the third stop band corresponds to a communication band of equal to or higher than 1559 MHz and equal to or lower than 1608 MHz, the second pass band corresponds to a communication band of equal to or higher than 1710 MHz and equal to or lower than 2370 MHz, the first stop band corresponds to a communication band of equal to or higher than 2402 MHz and equal to or lower than 2481.5 MHz, the first pass band corresponds to a communication band of equal to or higher than 2510 MHz and equal to or lower than 2690 MHz, and the at least one other filter devices includes:

a first filter device having a pass band corresponding to a communication band of equal to or higher than 690 MHz and equal to or lower than 960 MHz, a second filter device having a pass band corresponding to the communication band of equal to or higher than 1428 MHz and equal to or lower than 1511 MHz, a third filter device having a pass band corresponding to the communication band of equal to or higher than 1559 MHz and equal to or lower than 1608 MHz, and a fourth filter device having a pass band corresponding to the communication band of equal to or higher than 2402 MHz and equal to or lower than 2481.5 MHz.

* * * * *